US006821802B2

(12) United States Patent
Ahn et al.

(10) Patent No.: US 6,821,802 B2
(45) Date of Patent: Nov. 23, 2004

(54) SILICON INTERPOSER WITH OPTICAL CONNECTIONS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 420 days.

(21) Appl. No.: 09/935,233

(22) Filed: Aug. 22, 2001

(65) Prior Publication Data

US 2002/0003232 A1 Jan. 10, 2002

Related U.S. Application Data

(62) Division of application No. 09/143,880, filed on Aug. 31, 1998, now Pat. No. 6,392,296.

(51) Int. Cl.[7] .............................................. H01L 21/00
(52) U.S. Cl. ......................................... 438/27; 438/108
(58) Field of Search ........................... 438/27, 65, 108, 438/109

(56) References Cited

U.S. PATENT DOCUMENTS

| | | | |
|---|---|---|---|
| 3,923,567 A | 12/1975 | Lawrence | 156/7 |
| 3,959,047 A | 5/1976 | Alberts et al. | 156/8 |
| 3,982,268 A | 9/1976 | Anthony et al. | 357/55 |
| 4,081,701 A | 3/1978 | White, Jr. et al. | 307/355 |
| 4,394,712 A | 7/1983 | Anthony | 361/411 |
| 4,595,428 A | 6/1986 | Anthony et al. | 148/187 |
| 4,631,636 A | 12/1986 | Andrews | 361/385 |
| 4,653,025 A | 3/1987 | Minato et al. | 365/154 |
| 4,710,798 A | 12/1987 | Marcantonio | 357/80 |
| 4,713,841 A | 12/1987 | Porter et al. | 455/608 |
| 4,739,446 A | 4/1988 | Landis | 361/385 |
| 4,870,470 A | 9/1989 | Bass, Jr. et al. | 357/23.5 |
| 4,977,439 A | 12/1990 | Esquivel et al. | 357/49 |

(List continued on next page.)

FOREIGN PATENT DOCUMENTS

| | | | |
|---|---|---|---|
| JP | 4-133472 | 5/1992 | |
| JP | 05-129666 | 5/1993 | H01L/35/30 |
| WO | 94/05039 | 3/1994 | H01L/23/48 |

OTHER PUBLICATIONS

Beddingfield, C., et al., "Flip Chip Assembly of Motorola Fast Static RAM Known Good Die", *1997 Proceedings, 47th Electronic Components and Technology Conference*, San Jose, CA, 643–648, (May 18–21, 1997).

Blalock, T.N., et al., "A High–Speed Clamped Bit–Line Current–Mode Sense Amplifier", *IEEE Journal of Solid–State Circuits, 26(4)*, 542–548, (Apr. 1991).

(List continued on next page.)

*Primary Examiner*—William David Coleman
(74) *Attorney, Agent, or Firm*—Schwegman, Lundberg, Woessner & Kluth, P.A.

(57) ABSTRACT

An improved electronic packaging assembly is provided for increasing the operational bandwidth between different circuit devices, e.g. logic and memory chips, without requiring changes in current CMOS processing techniques. The electronic packaging assembly includes the use of a silicon interposer. The silicon interposer can consist of recycled rejected wafers from the front-end semiconductor processing. The electronic packaging assembly also includes at least one, or a number of, semiconductor chips located on opposing surfaces of the silicon interposer. Micro-machined vias are formed through the silicon interposer. The micro-machined vias include electrical contacts which couple various integrated circuit devices located on the opposing surfaces of the silicon interposer. An optical detector and an optical emitter are located on the silicon interposer and couple the silicon interposer to a fiber optical network.

23 Claims, 13 Drawing Sheets

U.S. PATENT DOCUMENTS

| | | | |
|---|---|---|---|
| 5,061,987 A | 10/1991 | Hsia | 357/71 |
| 5,079,618 A | 1/1992 | Farnworth | 357/81 |
| 5,153,814 A | 10/1992 | Wessely | 361/382 |
| 5,168,334 A | 12/1992 | Mitchell et al. | 257/324 |
| 5,229,327 A | 7/1993 | Farnworth | 437/209 |
| 5,258,648 A | 11/1993 | Lin | 257/778 |
| 5,275,001 A | 1/1994 | Yokotani et al. | 62/3.7 |
| 5,313,361 A | 5/1994 | Martin | 361/699 |
| 5,317,197 A | 5/1994 | Roberts | 257/401 |
| 5,343,366 A | 8/1994 | Cipolla et al. | 361/785 |
| 5,352,998 A | 10/1994 | Tamino | 333/247 |
| 5,362,976 A | 11/1994 | Suzuki | 257/81 |
| 5,392,407 A | 2/1995 | Heil et al. | 395/325 |
| 5,409,547 A | 4/1995 | Watanabe et al. | 136/204 |
| 5,415,699 A | 5/1995 | Harman | 138/238 |
| 5,432,823 A | 7/1995 | Gasbarro et al. | 375/356 |
| 5,438,224 A | 8/1995 | Papageorge et al. | 257/777 |
| 5,468,681 A | 11/1995 | Pasch | 437/183 |
| 5,532,506 A | 7/1996 | Tserng | 257/276 |
| 5,567,654 A | 10/1996 | Beilstein, Jr. et al. | 437/209 |
| 5,574,923 A | 11/1996 | Heeb et al. | 395/800 |
| 5,587,119 A | 12/1996 | White | 264/104 |
| 5,598,031 A | 1/1997 | Groover et al. | 257/668 |
| 5,598,039 A | 1/1997 | Weber | 307/38 |
| 5,610,366 A | 3/1997 | Fleurial et al. | 136/202 |
| 5,618,752 A | 4/1997 | Gaul | 438/626 |
| 5,622,875 A | 4/1997 | Lawrence | 438/691 |
| 5,633,962 A | 5/1997 | Kurata | 385/24 |
| 5,637,828 A | 6/1997 | Russell et al. | 174/52.2 |
| 5,646,067 A | 7/1997 | Gaul | 437/180 |
| 5,656,548 A | 8/1997 | Zavracky et al. | 438/23 |
| 5,657,481 A | 8/1997 | Farmwald et al. | 395/551 |
| 5,682,062 A | 10/1997 | Gaul | 257/686 |
| 5,692,558 A | 12/1997 | Hamilton et al. | 165/80.4 |
| 5,699,073 A * | 12/1997 | Lebby et al. | 345/82 |
| 5,699,291 A | 12/1997 | Tsunemine | 365/149 |
| 5,714,791 A | 2/1998 | Chi et al. | 257/467 |
| 5,747,728 A | 5/1998 | Fleurial et al. | 136/203 |
| 5,753,529 A | 5/1998 | Chang et al. | 437/67 |
| 5,767,001 A | 6/1998 | Bertagnolli et al. | 438/455 |
| 5,781,746 A | 7/1998 | Fleck | 395/306 |
| 5,786,628 A | 7/1998 | Beilstein, Jr. et al. | 257/684 |
| 5,807,783 A | 9/1998 | Gaul et al. | 438/406 |
| 5,821,624 A | 10/1998 | Pasch | 257/776 |
| 5,834,799 A * | 11/1998 | Rostoker et al. | 257/98 |
| 5,855,735 A | 1/1999 | Takada et al. | 156/636.1 |
| 5,861,666 A | 1/1999 | Bellaar | 257/686 |
| 5,901,050 A | 5/1999 | Imai | 361/820 |
| 5,902,118 A | 5/1999 | Hubner | 438/106 |
| 5,903,018 A | 5/1999 | Shimawaki | 257/198 |
| 5,903,045 A | 5/1999 | Bertin et al. | 257/621 |
| 5,915,167 A | 6/1999 | Leedy | 438/108 |
| 5,990,550 A | 11/1999 | Umezawa | 257/712 |
| 5,990,564 A | 11/1999 | Degani et al. | 257/778 |
| 5,991,161 A | 11/1999 | Samaras et al. | 361/760 |
| 6,016,256 A | 1/2000 | Crane, Jr. et al. | 361/813 |
| 6,137,164 A | 10/2000 | Yew et al. | 257/686 |
| 6,219,237 B1 | 4/2001 | Geusic et al. | 361/699 |
| 6,223,273 B1 | 4/2001 | Kanekawa et al. | 712/33 |
| 6,281,042 B1 | 8/2001 | Ahn et al. | 438/108 |

OTHER PUBLICATIONS

Cao, L., et al., "A Novel "Double–Decker" Flip–Chip/BGA Package for Low Power Giga–Hertz Clock Distribution", *1997 Proceedings, 47th Electronic Components and Technology Conference*, San Jose, CA, 1152–1157, (May 18–21 (1997).

Crisp, R., "Development of Single–Chip Multi–GB/s DRAMs", *Digest of International Solid–State Circuits Conference*, 226–227, (1997).

Crisp, R., "Rambus Technology, the Enabler", *Conference Record of WESCON*, Anaheim, CA, 160–165, (Nov. 17–19, 1992).

Demmin, J., "nCHIP's Silicon Circuit Board Technology", *National Electronic Packaging and Production Conference, NEPCON West 94, 3*, Proceedings of the Technical Program, 2038–9, (1993).

Donnelly, K.S., et al., "A 660MB/s Interface Megacell Portable Circuit in −.3 mum–0.7 mum CMOS ASIC ", *IEEE Journal of Solid–State Circuits, vol. 32*, 1995–2003, (Dec. 1996).

Feinberg, I., et al., "Interposer for Chip–on–Chip Module Attachment", *IBM Technical Disclosure Bulletin, 26(9)*, 4590–91, (Feb. 1984).

Foster, R., et al., "High Rate Low–Temperature Selective Tungsten", *In: Tungsten and Other Refractory Metals for VLSI Applications III*, V.A. Wells, ed., Materials Res. Soc., Pittsburgh, PA, 69–72, (1988).

Goodman, T., et al., "The Flip Chip Market", *Advanced Packaging*, 24–25, (Sep./Oct. 1997).

Gray, P.R., et al., "Analysis and Design of Analog and Integrated Circuits", *John Wiley and Sons, 2nd ed.*, 617–622, (1984).

Heremans, P., et al., "Optoelectronic Integrated Receiver for Inter–MCM and Inter–Chip Optical Interconnects", *Technical Digest, International Electron Devices Meeting*, 657–660, (Dec. 1996).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Horowitz, M., et al., "PLL Design for a 500mbs Interface", *Dig. International Solid–State Circuits Conference*, 160–161, (1993).

Huth, N., "Next–Generation Memories", *Electronik, 42(23)*, 36–44, (1993).

Krishnamoorthy, A.V., et al., "Ring Oscillators with Optical and Electrical Readout Based on Hybrid GaAs MQW Modulators Bonded to 0.8 Micron Silicon VLSI Cricuits", *Electronics Lett. 31(22)*, 1917–18, (Oct. 26, 1995).

Lee, T.H., et al., "A 2.5V Delay–Locked Loop for an 18Mb 500MB/s DRAM", *Digest of International Solid–State Circuits Conference*, 300–301, (1994).

Lehmann, V., "The Physics of Macropore Formation in Low Doped n–Type Silicon", *Journal of the Electrochemical Society, 140(10)*, 2836–2843, (Oct. 1993).

Lin, C.M., et al., "Precision Embedded Thin Film Resistors for Multichip Modules (MCM–D)", *Proceedings IEEE Multichip Module Conference*, 44–9, (1997).

Mimura, T., et al., "System Module: a New Chip–on–Chip Module Technology", *Proceedings of 1997 IEEE Custom Integrated Circuit Conference*, 439–442, (1997).

Muller, K., et al., "Trench Storage Node Technology for Gigabit DRAM Generations", *Digest IEEE International Electron Devices Meeting*, San Francisco, CA, 507–510, (Dec. 1996).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Patel, N.G., et al., "Thermoelectric Cooling Effect in a p–Sb2Te3/n–Bi2Te3 Thin Film Thermocouple", *Solid–State Electronics 35(9)*, 1269–72, (1992).

Ramo, S., et al., *Fields and Waves in Communication Electronics, Third Edition*, John Wiley & Sons, Inc., pp. 428–433, (1994).

Rucker, T.G., et al., "A High Performance SI on SI Multichip Module Technology", *1992 Symposium on VLSI Technology. Digest of Technical Papers, IEEE*, Japanese Society of Applied Physics, 1992 Seattle, WA, 72–73, (Jun. 2–4 1992).

Sekine, et al., "A New High–Density Plasma Etching System Using a Dipole–Ring Magnet", *Jpn. J. Appl. Phys., Pt. 1, No. 11*, 6274–6278, (Nov. 1995).

Seraphim, D.P., et al., "Principles of Electronic Packaging.", *In: Principles of Electronic Packaging*, McGraw–Hill, New York, NY, 44, 190, 595–597, (1989).

Shafai, C., et al., "A Micro–Integrated Peltier Heat Pump for Localized On–chip Temerature Control.", *Canadian Journal of Physics, 74, Suppl., No. 1*, S139–142, (1996).

Shafai, C., et al., "Optimization of Bi2Te3 Thin Films for Microintegrated Peltier Heat Pumps", *Journal of Vacuum Science and Technology A, Second Series 15, No. 5*, Preliminary Program, 44th National Symposium of the AVS, San Jose, CA, 2798–2801, (Sep./Oct. 1997).

Su, D.K., et al., "Experimental Results and Modeling Techniques for Substrate Noise in Mixed–Signal Integrated Circuits", *IEEE Journal of Solid–State Circuits, 28(4)*, 420–430, (Apr. 1993).

Vardaman, E.J., et al., "CSPs: Hot new packages for cool portable products", *Solid State Technology, 40(10)*, 84–89, (Oct. 1997).

Vendier, O., et al., "A 155 Mbps Digital Transmitter Using GaAs Thin Film LEDs Bonded to Silicon Driver Circuits", *Digest IEEE/LEOS 1996 Summer Topical Meetings*, Advanced Aplications of Lasers in Materials and Processing, 15–16, (1996).

Vusirikala, V., et al., "Flip–chip Optical Fiber Attachment to a Monolithic Optical Receiver Chip", *SPIE Proceedings (The International Society for Optical Engineering)*, 2613, 52–58, (Oct. 24, 1995).

* cited by examiner

SILICON INTERPOSER WITH OPTICAL CONNECTIONS

This application is a divisional of U.S. application, Ser. No. 09/143,880, filed on Aug. 31, 1998, now U.S. Pat. No. 6,392,296 B1 the specification of which is incorporated herein by reference.

FIELD OF THE INVENTION

The present invention relates generally to semiconductor integrated circuits. More particularly, it pertains to a silicon interposer with optical connections.

BACKGROUND OF THE INVENTION

There is a growing desire for "system on a chip" as integrated circuit technology makes steady progress and revolutionizes our daily life. Ideally, we would like to build a computing system by fabricating all the necessary integrated circuits on one wafer, as compared with today's method of fabricating many chips of different functions and packaging them to assemble a system. The concept of "system on a chip" has been around for a long time, but in practice, it is very difficult with today's technology to implement such a truly high-performance system because of vastly different fabrication processes and different manufacturing yields for the logic and memory circuits. To overcome some of these problems, Intel demonstrated a high-performance microprocessor and cache core based on a silicon-on-silicon multichip module technology. This technology was designed to have low interconnect parasitics and low cost. A 40 to 50% clock rate improvement was realized over a conventional packaging approach. More recently, a "system module" has recently been introduced. The module consists of two chips (logic and memory) with Chip A stacked on Chip B in a structure called Chip-on-Chip (COC) using a micro bump bonding technology (MBB). For high-performance computing systems, it is highly desirable for the microprocessor and memory devices to be located with close proximate for faster communication (high bandwidth). This leads to the consideration of very large chips and attendant lower wafer yield and productivity. However, even the largest chips which can be economically produced in any lithographic generation can contain only a relatively very small system. Therefore, in the foreseeable future, rather than building a truly integrated chip, the present trend of packaging several chips on a module will continue, but with the level of integration, on a given chip, being in part determined by the packaging capabilities. It will also be desirable to package chips in closer proximity to achieve higher performance. Another important objective is too reduce the energy required per switching event in driving circuits on the module.

SUMMARY OF THE INVENTION

The above mentioned problems with integrated circuits and other problems are addressed by the present invention and will be understood by reading and studying the following specification. An electronic packaging assembly which accords these benefits is provided.

In particular, an improved electronic packaging assembly is provided for increasing the operational bandwidth between different circuit devices, e.g. logic and memory chips, without requiring changes in current CMOS processing techniques. The electronic packaging assembly includes the use of a silicon interposer. The silicon interposer can consist of rejected wafers recycled from front-end semiconductor processing. This provides the added advantage of low cost and availability. A silicon interposer is thermally matched to the circuit devices such that coefficient of expansion mismatches are nonexistent. And, deposition of conductors on the silicon interposer's surface is readily accomplished using a standard integrated circuit multi-layer metallurgy.

The electronic packaging assembly also includes at least one, or a number of, semiconductor chips located on opposing surfaces of the silicon interposer. Micro-machined vias are formed through the silicon interposer. The micro-machined vias include electrical contacts which couple various integrated circuit devices located on the opposing surfaces of the silicon interposer. An optical detector and an optical emitter are located on the silicon interposer and couple the silicon interposer to a fiber optical network. Improved performance in the form of higher bandwidth and a lower required energy per switching event is provided by this novel electronic packaging assembly.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
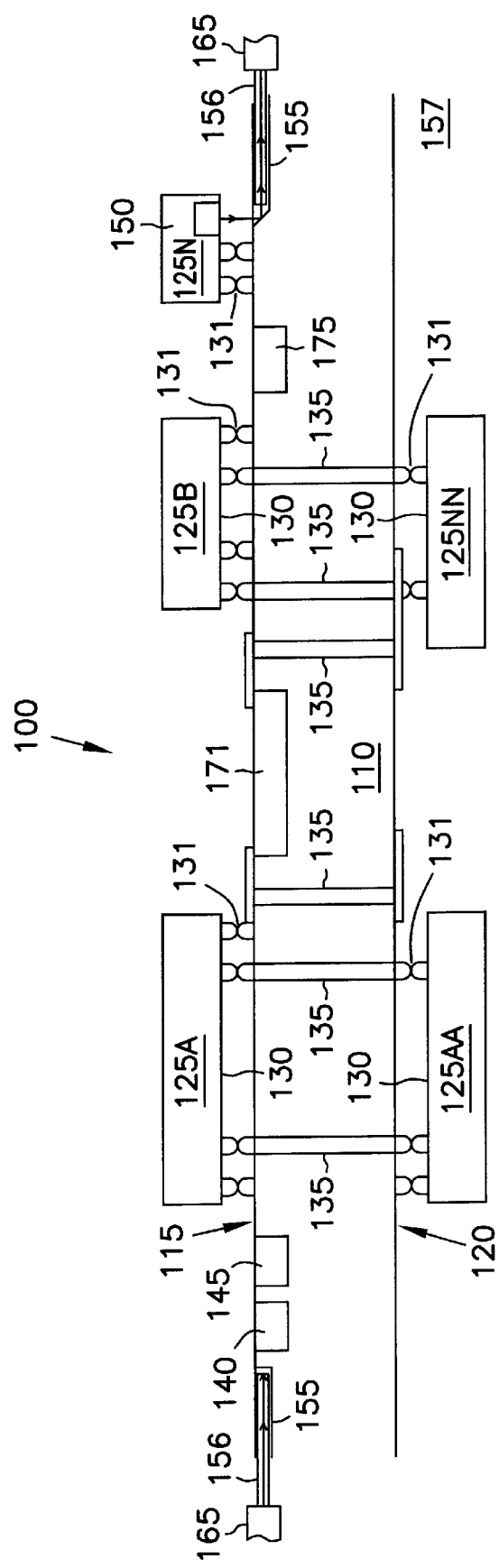
FIG. 1 is a cross-sectional view illustrating an electronic packaging assembly according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate includes, but is not limited to, bulk semiconductive materials such as a semiconductor wafer and semiconductive material layers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

This disclosure provides an elegant method of packaging microprocessors, SRAMs, DRAMs, and other tested chips (known good dies -KGD) on a common silicon interposer in order to build a compact multichip module (MCM). The silicon interposer is essentially a big chip. Use of silicon as the interposer substrate material has certain advantages. Silicon is inexpensive and readily available for the application described herein. Silicon is thermally matched to the package components. The characteristics of the silicon match those of the integrated-circuit die. Crystalline silicon has good thermal characteristics. Silicon also has the advantage that deposition of conductors on its surface is readily accomplished using a standard integrated circuit (IC) multilayer metallurgy. The thermal coefficient of expansion mismatches are nonexistent so only transient temperature changes must be considered in determining fatigue requirements. Finally, existing packaging materials and technologies can be used to connect the silicon interposer to a chip package. An exemplary embodiment for constructing the same is provided in U.S. Pat. No. 5,598,031, G. L. Groover, et al, "Electrically and thermally enhanced package using a separate silicon substrate." Another exemplary embodiment for constructing the same is provided in U.S. Pat. No. 5,061,987, Hsia, Yukun, "Silicon substrate multichip assembly."

FIG. 1 is a cross-sectional view illustrating an electronic packaging assembly 100, or electronic system module 100, according to the teachings of the present invention. FIG. 1 includes a silicon interposer 110. The silicon interposer 110 has opposing surfaces which include a first one 115 of the opposing surfaces, or first side 115 and a second one 120 of opposing surfaces, or second side 120. In one exemplary embodiment, the silicon interposer 110 includes rejected silicon wafers which have been recycled from the front-end of the semiconductor fabrication process. The silicon interposer 110 may have active and passive devices built on one or both sides, 115 and 120. Further, the active and passive devices built on one or both sides, 115 and 120, can also include simple capacitors using the insulator and metallurgy on one side of the interposer, and can include devices such as, for example driver circuits. The electronic packaging assembly 100 includes a number of flip chips, 125A, 125B, . . . , 125N respectively, located on the first side 115 of the silicon interposer 110. The electronic packaging assembly 100 additionally includes a number of flip chips, 125AA, 125BB, . . . , 125NN respectively, located on the second side 120 of the silicon interposer 110. In one embodiment, the a number of flip chips, 125A, 125B, . . . , 125N respectively, located on the first side 115 includes at least one semiconductor chip which is a microprocessor chip or other suitable logic chip. In one embodiment, the number of flip chips, 125AA, 125BB, . . . , 125NN respectively, located on the second side 120 includes at least one semiconductor chip which is a memory chip. The memory chip can include a dynamic random access memory (DRAM)-type chip. Likewise, the memory chip can include a static random access memory (SRAM)-type chip or flash electrically erasable program read only memory (flash EEPROM)-type chip.

In alternative embodiments, the nature of the flip, or semiconductor, chips coupled respectively to the first and second sides can be reversed or varied in any desired order. In one embodiment, capacitors are similarly included amongst the number of flip-chips, 125A, 125B, . . . , 125N, or, 125AA, 125BB, . . . , 125NN, and coupled to the first or second side, 115 and 120 respectively. Likewise, microprocessors and memory chips may be coupled to the same side of the silicon interposer. In one embodiment, a second or even multiple microprocessors, capacitors, and memory chips are included in the number of flip-chips, 125A, 125B, . . . , 125N, or, 125AA, 125BB, . . . , 125NN, and coupled with their circuit side 130 facing the first or second side, 115 and 120 respectively, of the silicon interposer.

In constructing the silicon interposer 110 it is of course necessary to complete all the high-temperature process steps prior to the deposition of the interconnection metallurgy. In one embodiment, the microprocessors or logic chips are included amongst the number of flip-chips, 125A, 125B, . . . , 125N, and are mounted with the circuit side 130 face-down (active circuit facing downward) to the silicon interposer 110 by a ball-grid array (BGA) 131, micro-bump bonding (MBB) 131, or controlled collapse chip connections (C-4) 131. In the same embodiment, DRAM chips which are included amongst the number of flip-chips, 125AA, 125BB, . . . , 125NN are mounted on the other side of the silicon interposer 110 with the active circuits facing upward using the same or similar connection technology. Since chips will be mounted on both sides of the interposer one must be cognizant of the effects of high temperature on the solder joints previously made. This problem may be solved either by using only localized heating to reflow the solder on the second surface 120 or by using an appropriate solder hierarchy. In one embodiment, lead 2.5% (by weight) Pb—Sn solder is used on the C-4 joints of the chips, 125A, 125B, . . . , 125N, mounted on the first side 115. In the same embodiment then, Pb-11 wt. % Sb is used for the chips, 125AA, 125BB, . . . 125NN, mounted on the second side 120, and Pb-62 Wt % Sn is used for card soldering. In alternative embodiments, other lower-melting point alloys, for example, Ga-based alloys can also be used.

FIG. 1 further illustrates that a number of electrical connections 135 couple the number of semiconductor chips, 125A, 125B, . . . , 125N, mounted on the first side 115 to the number of semiconductor chips, 125AA, 125BB, . . . , 125NN, mounted on the second side 120 of the silicon interposer 110. The number of electrical connections 135 include micro-machined vias which are formed according to the detailed description provided below in connection with FIGS. 3A–3G. The detailed description below for the number of electrical connections 135 is provided according to techniques taught in co-pending application Ser. No. 08/917,443, entitled "Integrated Circuitry and Methods of Forming Integrated Circuitry," filed on Aug. 22, 1997 or according to techniques taught in application Ser. No. 08/917,449, entitled "Methods of Forming Coaxial Integrated Circuitry Interconnect Lines, and Integrated Circuitry," filed on Aug. 22, 1997, which applications are incorporated herein by reference.

The signal connections from the electronic packaging assembly 100 to other components in an extended electronic system is provided by energy-efficient optical fiber interconnections. The open space between the number of semiconductor chips, 125A, 125B, . . . , 125N, 125AA, 125BB, . . . , 125NN, and the silicon interposer 110 is encapsulated with an epoxy or other appropriate substance for passivation as well as improving the fatigue characteristics of the BGA 131. Microprocessor chips usually run at a much higher temperature than the memory chips and need to be cooled. Therefore, in one embodiment the back side of any microprocessors included amongst number of semiconductor chips, 125A, 125B, . . . , 125N, 125AA, 125BB, . . . , 125NN are exposed to cooling air. In another embodiment, such microprocessors are liquid cooled using the technique detailed in the co-filed, co-pending application, attorney docket 303.536us1, entitled "Structure and Method for Electronic Assembly," or using solid state Peltier junctions according to the technique detailed in the co-filed, co-pending application, attorney docket 303.533us1, entitled "Compact System Module with Built-in Thermoelectric Cooling."

FIG. 1 illustrates an optical receiver 140 adapted to receiving input signals from a fiber optical network 165. The optical receiver 140 is further coupled to a sense amplifier 145. The sense amplifier 145 and optical receiver 140 are located on the silicon interposer 110. The sense amplifier 145 is further coupled to at least one of the multiple semiconductor chips, 125A, 125B, . . . , 125N, mounted on the first side 115 of the silicon interposer 110. Also illustrated in FIG. 1 is an optical emitter 150. The optical emitter 150 couples signals from at least one of the multiple semiconductor chips, 125A, 125B, . . . , 125N, mounted on the first side 115 of the silicon interposer 110 to the fiber optical network. FIG. 1 provides an illustration of the V-grooves 155 located on the silicon interposer 110. Optical fibers 156 are mounted in the V-grooves 155 on the silicon interposer 110. In one embodiment, the optical receiver 140 includes a thyristor detector 140. Further, in one particular embodiment, the thyristor detector 140 includes a silicon thyristor detector 140. In an alternative embodiment, the thyristor detector 140 includes a gallium arsenide (GaAs) thyristor detector 140. In one embodiment, the optical emitter 150 includes a light-emitting diode (LED) 150. The light-emitting diode (LED) 150 can be, for instance, a gallium arsenide (GaAs) emitter. In one embodiment, the sense amplifier 145 includes a current sense amplifier 145. In one embodiment, as illustrated in FIG. 1, the coupling between the optical emitter 150 and the fiber optical network 165 includes optical fibers 156 mounted in V-grooves 155 on the silicon interposer 110. This optical coupling can be achieved in any suitable manner such as, for example, the method described in V. Vusirikala, et al., "Flip-chip optical fiber attachment to a monolithic optical receiver chip," Proc. SPIE Emerging Components and Technologies for all Optical Networks, Philadelphia, Pa., USA, Oct. 24 1995, pp. 52–58. In one embodiment, the optical emitter 150 is flip chip bonded to the silicon interposer and an end 157 in a V-groove 155 is adapted to reflect light from the optical emitter 150 into the optical fibers 156. This technique, too can be achieved in any suitable manner such as, for example, the method described in O. Vendier et al., "A 155 Mbps digital transmitter using GaAs thin film LEDs bonded to silicon driver circuits," Dig. IEEE/LEOS Summer Topical Mtg., Keystone Colo., Aug. 5–9 1996, pp. 15–16.

Figure 2A:
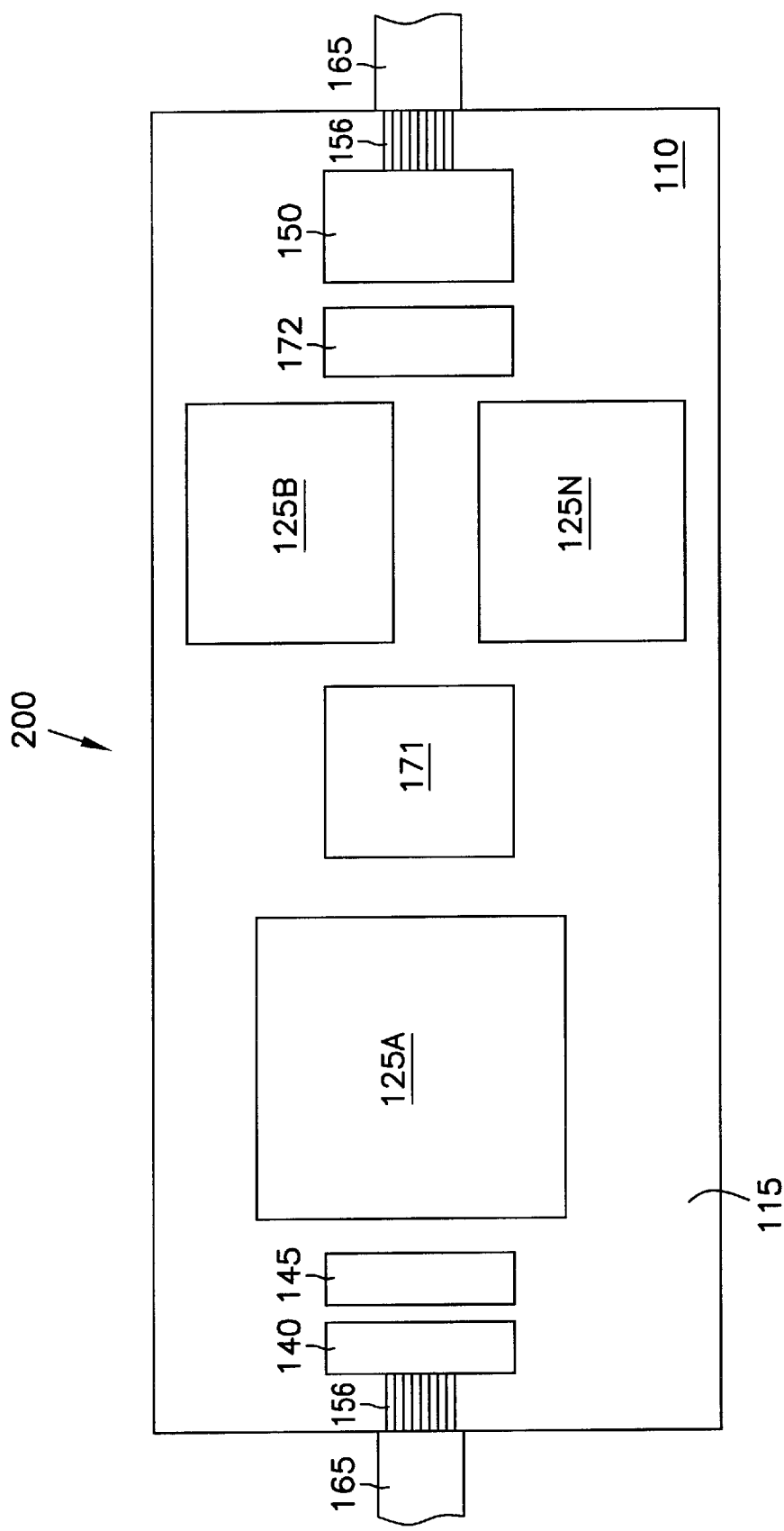
FIG. 2A is a top view illustrating the embodiment of the electronic packaging assembly of FIG. 1.

FIG. 2A provides a top view of electronic packaging assembly 200. FIG. 2A illustrates the number of semiconductor chips, or number of flip chips, 125A, 125B, . . . , 125N, mounted on atop surface 115 of the silicon interposer 110. Seen in this top view are the number of optical fibers 156 which couple both to the optical detector 140 and the optical emitter 150. Also shown in the top view of FIG. 2A are a number of circuits 171 included on the silicon interposer to connect various of the multiple semiconductor chips, 125A, 125B, . . . , 125N, mounted on the first side 115, or the number of semiconductor chips, 125AA, 125BB, . . . , 125NN, mounted on the second side 120 of the silicon interposer 110. In one embodiment, the number of electrical circuits are formed according to conventional metalization processes as will be recognized by one practicing in the field of wafer fabrication technology. FIG. 2A shows also provides an exemplary embodiment wherein driver circuits 172 couple between multiple semiconductor chips, 125A, 125B, . . . , 125N, mounted on the first side 115, or the number of semiconductor chips, 125AA, 125BB, . . . , 125NN, mounted on the second side 120 of the silicon interposer 110 and the optical emitter 150. FIG. 2A further illustrates the optical network 165 coupling to the individual optical fibers 156.

Figure 2B:
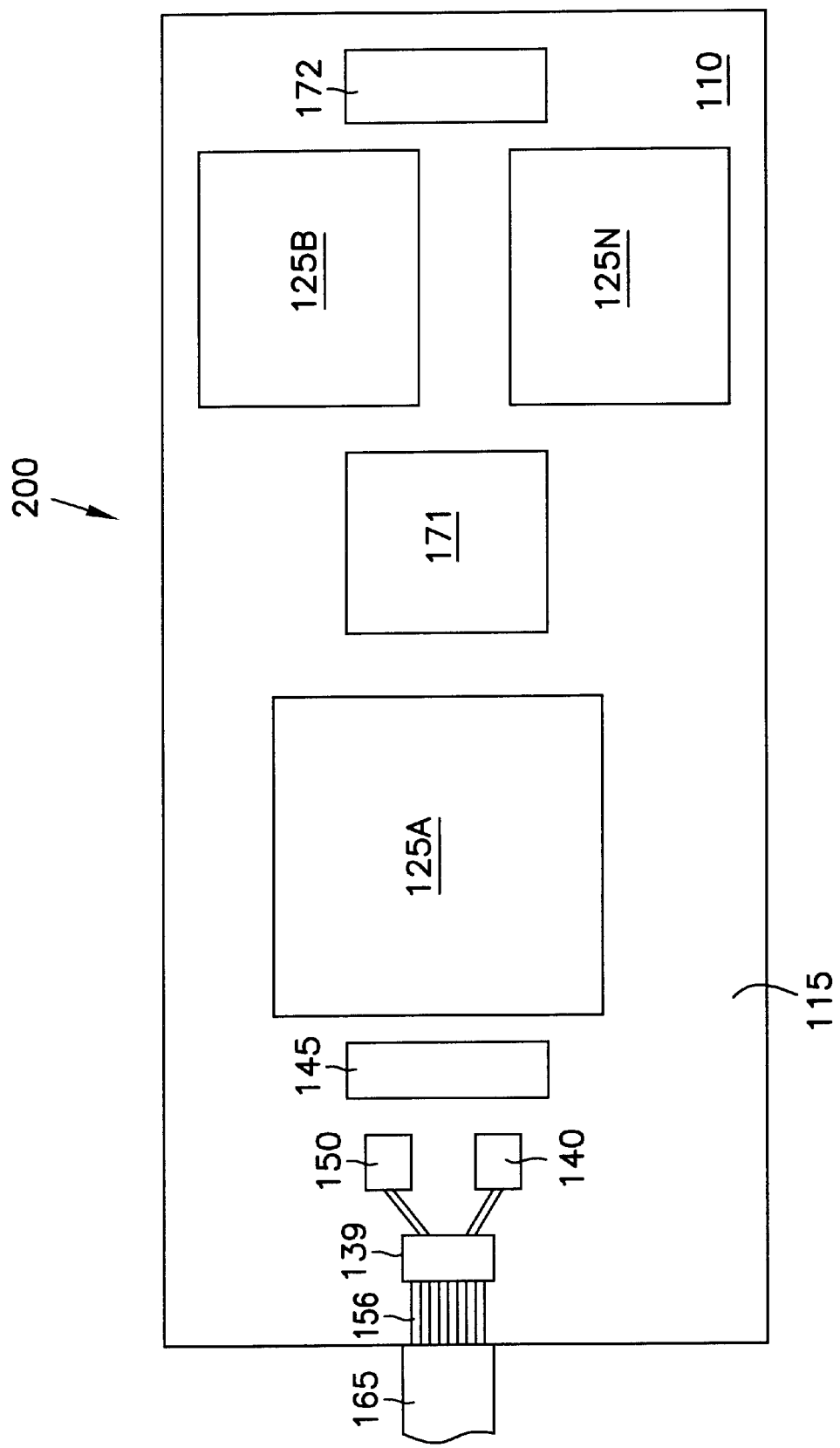
FIG. 2B provides a top view of an alternate embodiment of the electronic packaging assembly of FIG. 1.

FIG. 2B provides a top view of an alternate embodiment of electronic packaging assembly 200. FIG. 2B illustrates the number of semiconductor chips, or number of flip chips, 125A, 125B, . . . , 125N, mounted on a top surface 115 of the silicon interposer 110 as in FIG. 2A. However, in the embodiment of FIG. 2B, the optical network 165 includes two (2) way channel individual optical fibers 156. Accordingly, FIG. 2B illustrates the individual optical fibers 156 coupling to a beam splitter 139, beam modulator 139, or other suitable optical device 139, for separating and/or combining different frequencies of light. In the embodiment of FIG. 2B, several of the 2 way channel individual optical fibers 156 couple between the beam splitter 139 and an optical receiver 140. Other ones of the 2 way channel individual optical fibers 156 couple between the beam splitter 139 and an optical emitter 150.

Figure 3A:
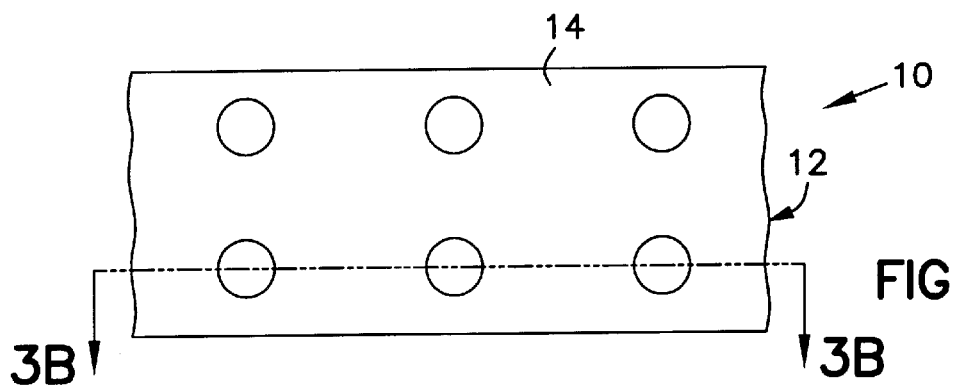
FIGS. 3A–3G illustrate an embodiment of a process of fabrication of a portion of the present invention.

FIGS. 3A–3G illustrate an embodiment of the various processing steps for fabricating the number of electrical connections 135 through the silicon interposer 110, as illustrated in FIG. 1. FIG. 3A, is a top view illustrating generally a semiconductor wafer fragment at 10.

Figure 3B:
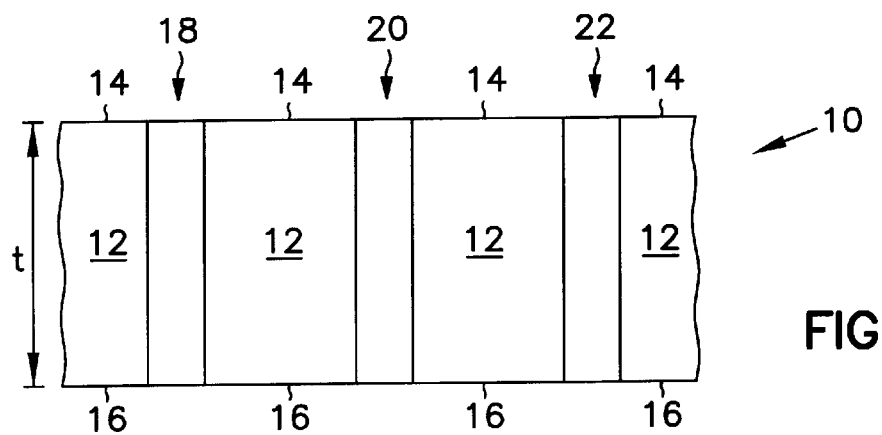

In FIG. 3B, a cross-sectional view of FIG. 3A, taken along cut-lines 3B—3B, is provided. The semiconductor wafer fragment at 10 includes a semiconductor conductive substrate. Wafer fragment 10 includes a front surface 14 and a back surface 16 and a thickness (t) which is defined between the surfaces. An exemplary thickness is around 30 mils or between around 750 to 800 micrometers ($\mu$m). FIG. 3B illustrates that amounts of the semiconductor conductive wafer material are removed to form holes or passageways 18, 20, and 22. In one embodiment, such holes are formed to a depth of not less than half of thickness (t). In one exemplary embodiment, holes 18, 20 and 22 extend perpendicularly through the entirety of wafer fragment 12 and join with front and back surfaces 14 and 16, respectively. In the exemplary embodiment, holes 18, 20, and 22 have aspect ratios greater than about 50. In another exemplary embodiment, the holes 18, 20, and 22 have aspect ratios between about 75 and 80.

In a preferred implementation, holes 18, 20, and 22 are formed or otherwise provided prior to processing of any integrated circuitry devices over either of surfaces 14, 16. In other words, the holes are formed prior to patterning any conductive material which is associated with integrated circuitry devices to be formed over either of surfaces 14 and 16. The holes 18, 20, and 22 are formed through suitable etching techniques. Alternatively, such holes are formed or drilled with a suitable laser. In one exemplary embodiment, very high aspect ratio holes are formed by placing the wafer in a semiconductor wafer processor including a dipole-ring magnetron etching reactor after which, the wafer is exposed to conditions within the dipole ring magnetron etching reactor which are sufficient to form holes which extend through the entirety of the wafer. A suitable dipole ring magnetron (DRM) reactor is described in an article entitled "Trench Storage Node Technology for Gigabit DRAM Generations," Technical Digest of International Electron Devices Meeting, Dec. 8–11, 1996, pages 507–510, published IEEE, Catalog No. 96CH35961 and authored by Muller et al. Likewise, a suitable DRM system and exemplary processing conditions are described in an article entitled "A New High-Density Plasma Etching System Using a Dipole-Ring Magnet," *Jpn. J. Appl. Phys,* 34, pt. 1, no. 11, November 1995, pages 6274–6278, and authored by Sekine et al. After formation of the holes 18, 20, and 22, the same can be temporarily filled with any material such as a photoresist to enable subsequent processing of integrated circuitry devices over either or both of surfaces 14 and 16.

Figure 3C:
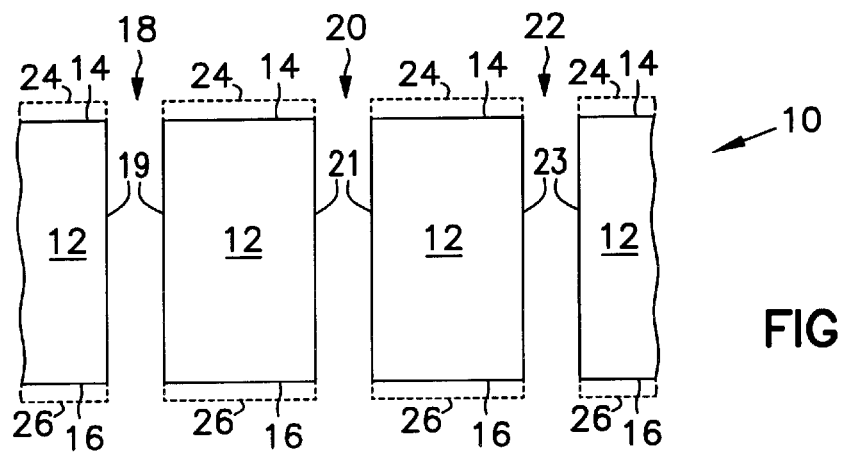

As shown in FIG. 3C and in accordance with an exemplary embodiment, integrated circuitry is formed or otherwise processed and supported by wafer fragment 10. Integrated circuitry 24 can be formed over or proximate front surface 14, back surface 16, or both front and back surfaces 14, 16, respectively.

Figure 3D:
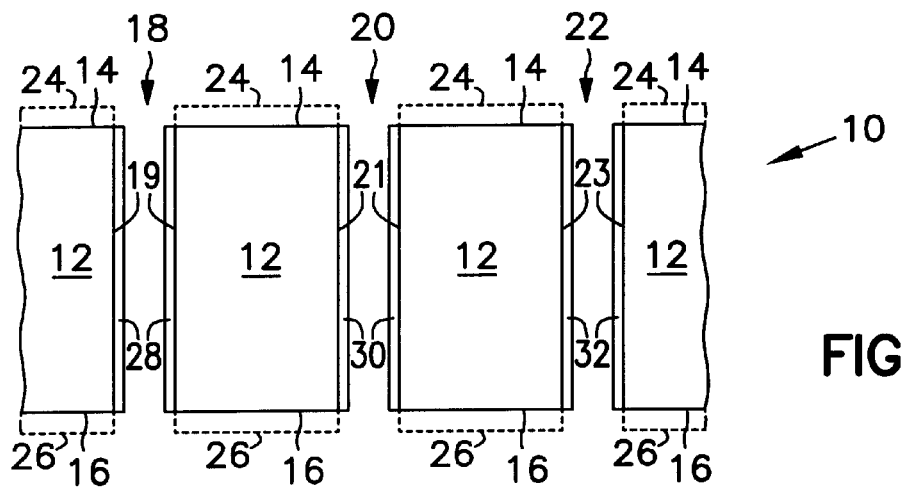

In FIG. 3D, wafer fragment 10 is exposed to conditions which are effective to form respective dielectric layers 28, 30, and 32 within each of the holes 18, 20, and 22, and proximate the respective interior surfaces 19, 21 and 23 thereof. In one embodiment, dielectric layers 28, 30, and 32 comprise a nitride-containing layer which is disposed proximate respective interior surfaces 19, 21, and 23. An oxide-containing layer is formed over the nitride-containing layer to provide a dielectric (NO) layer within the hole. In an exemplary embodiment, a nitride-containing layer is formed through chemical vapor deposition (CVD) and the oxide layer by exposing the substrate to oxidizing conditions. In one exemplary embodiment, dielectric layers 28, 30 and 32 can constitute reoxidized, low-pressure, chemical vapor deposition (LPCVD) on nitride film which forms the illustrated and preferred (NO) dielectric layer. An exemplary processing implementation includes in situ nitridation in ammonia an 950° C. LPCVD of nitride at 700° C. takes place with dichlorosilane and amonia. Subsequently, reoxidation of the nitride takes place at a temperature between 900° C. and 950° C. Alternatively, fast thermal processing (FTP) can implement the above-described three processing steps into a single processing run. Exemplary processing methods and systems are described in the Mueller et al. article referenced above. Alternatively, dielectric layers 28, 30 and 32 can comprise a thin, silicon dioxide film. A desired and exemplary thickness of such layers is between 50–100 nanometers (nm).

Figure 3E:
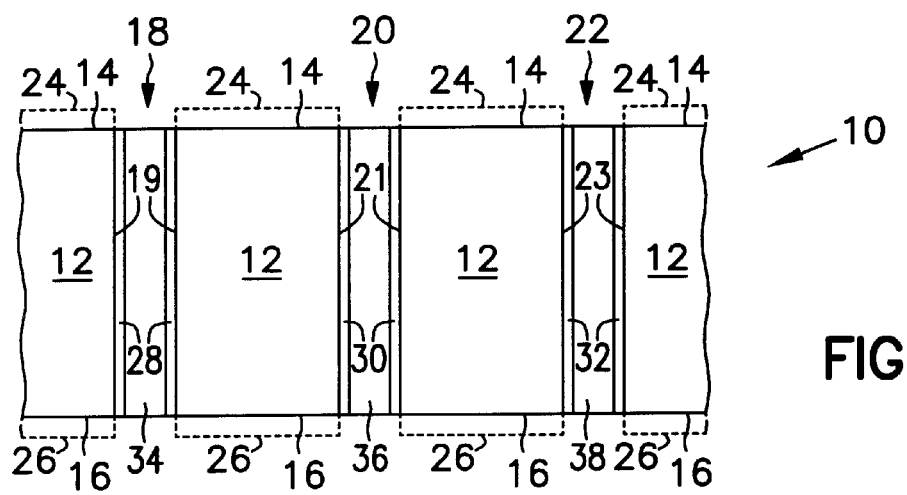

In FIG. 3E, electrical interconnect material 34, 36 and 38 is formed within holes 18, 20 and 22 respectively. Such material fills each hole and is capable of electrically interconnecting integrated circuitry formed over both front and back surfaces 14 and 16 respectively. In a preferred implementation, interconnect material 34, 36 and 38 constitute a first material which is formed within each respective hole and comprises polysilicon which is formed through CVD. Excess first material can be removed through conventional steps such as chemical mechanical planarization (CMP).

Figure 3F:
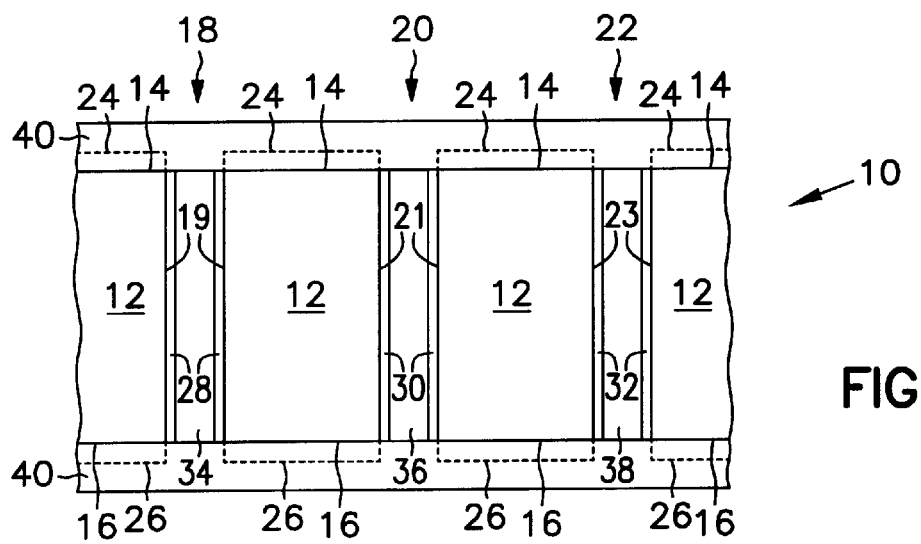

In FIG. 3F, a second layer of electrically conductive material 40 is formed over the first material 34, 36 and 38. In one embodiment, such material is formed over both front and back surfaces 14 and 16 respectively. In another embodiment, second material 40 constitutes comprising a metal material which is different from first material 34 and 36 and 38. In an exemplary embodiment, second material 40 constitutes an aluminum comprising layer or film. Such material film can be deposited through suitable sputtering or evaporation techniques. Mechanical mask can be utilized in order to define with more particularity the area over which the preferred aluminum layer is deposited. Alternatively, such a layer can be blanket deposited and subsequently processed as described below.

Figure 3G:
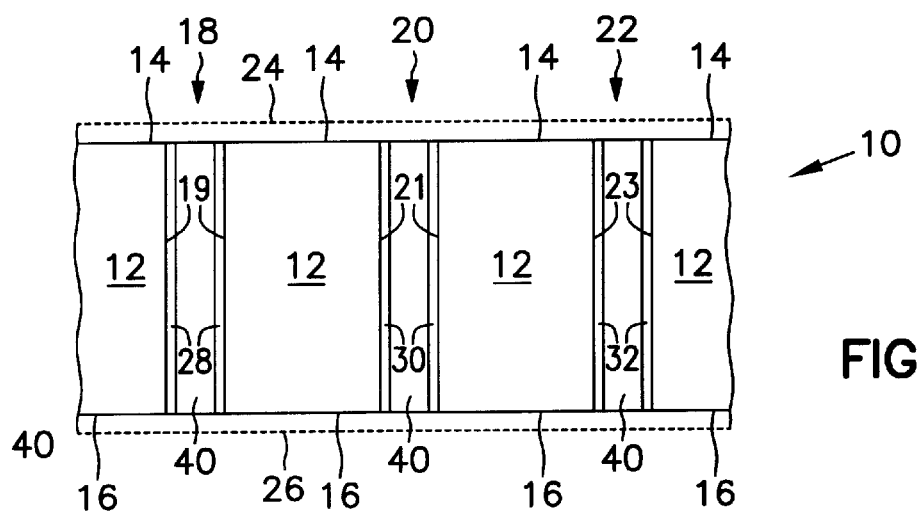

FIG. 3G illustrates the wafer fragment 10 is exposed to processing conditions which are effective to cause the second material 40 to replace the first material 34, 36 and 38. In an exemplary embodiment, the first material 34, 36 and 38 is completely replaced with the second material 40 and the second material 40 electrically interconnects at least some of the front surface integrated circuitry 24 with at least some back surface integrated circuitry 26. Exemplary processing conditions include annealing the wafer at a temperature greater than or equal to about 500° C. for a sufficient amount of time. The thickness of the second material 40 will be determined by the size and dimensions of the interconnecting holes or passageways. As a guideline, and for a 0.175 micron diameter and 1.7 micron deep hole with an aspect ratio of 10, an aluminum thickness of 0.5 micrometers ($\mu$m) is sufficient to substitute the preferred polysilicon. Annealing times and temperatures can be decreased by forming a thin, e.g., 0.2 micrometer, titanium (Ti) layer over material 40 prior to annealing. The Ti layer acts as a polysilicon capture layer which accelerates the replacement of polysilicon with aluminum. Exemplary processing methods are described in an article entitled "Novel High-Aspect Ratio Plug for Logic/DRAM LSIs Using Polysilicon-Aluminum Substrate (PAS)," *Technical Digest of International Flectron Devices Meeting,* Dec. 8–11, 1996, pages 946–948, published by IEEE, catalog number 96CH35961 and authored by Horie et al. Excess aluminum in the substitute for polysilicon can be removed through suitable processing techniques such as CMP. Alternately considered, a conductive interconnect is provided within wafer fragment 10 between and electrically connecting at least a portion of the front-formed integrated circuitry and the back-formed integrated circuitry. In the illustrated example, the integrated circuitry is formed in advance of the formation of the conductive interconnect.

In an alternate embodiment of the present invention, the method of forming coaxial integrated circuitry and interconnect lines is provided in application Ser. No. 08/917,449 entitled, "Methods of Forming Coaxial Integrated Circuitry Interconnect Lines, and Integrated Circuitry" filed on Aug. 22, 1997, which application is incorporated herein by reference.

Figure 4:
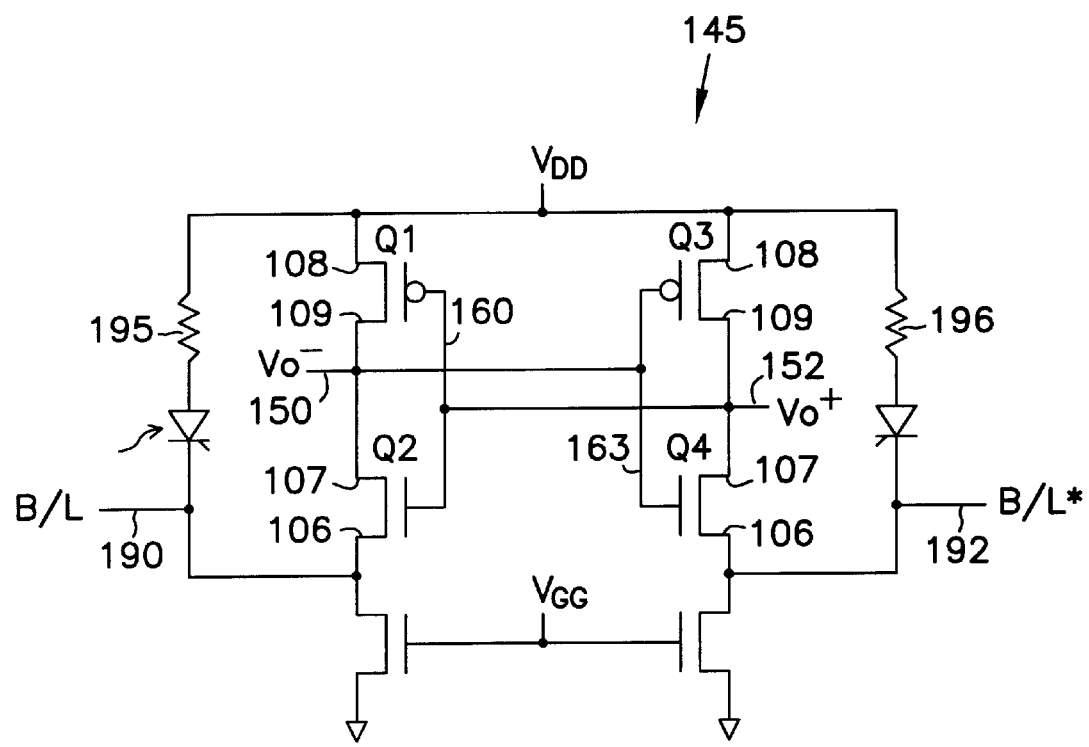
FIG. 4 is a schematic diagram of an embodiment of a sense amplifier according to the teachings of the present invention.

FIG. 4 is a schematic diagram illustrating an embodiment of a sense amplifier 145 according to the teachings of the present invention. In one exemplary embodiment, sense amplifier 145 is a current sense amplifier 145. Current sense amplifier 145 has two load resistors, 195 and 196.

The operation of the embodiment of the sense amplifier 145 is described in connection with the schematic diagram of FIG. 4. When a conventional memory cell is read, the data contained in that cell is placed on the bit line (B/L) associated with the cell. Each bit line (B/L) includes a complementary bit line (B/L*). In FIG. 4, by way of illustration and not for limitation, the data cell bit line is illustrated by bit line (B/L) 190 and the complementary bit line is illustrated by bit line (B/L*) 192. In FIG. 4, the cross coupled part of current sense amplifier 50 comprises four transistors, $Q_1$, $Q_2$, $Q_3$ and $Q_4$ respectively. Transistors $Q_2$ and $Q_4$ are n-channel metal oxide semiconductor (NMOS) transistors. Transistors $Q_1$ and $Q_3$ are p-channel metal oxide semiconductor (PMOS) transistors. During a read cycle, the input/output lines shown as 150 and 152 are precharged to some fractional voltage of $V_{cc}$, hence, placing a positive voltage on lines 150 and 152. This positive voltage is passed to the gates of NMOS transistors, $Q_2$ and $Q_4$, turning them on. Activation of NMOS transistors, $Q_2$ and $Q_4$, permits conduction between emitter/source regions 106 and collector/drain regions 107 in transistors $Q_2$ and $Q_4$. Conduction in transistors $Q_2$ and $Q_4$ couple bit lines B/L 190 and B/L* 192 with input/output lines, 150 and 152 respectively. Input/output line 150 is coupled to the gates of inverter 104 and input/output line 152 is coupled to the gates of inverter 103. If bit line B/L 190 carries a logic state "0", the cross-coupled structure will cause the gate of PMOS transistor $Q_3$ to go low, turning on transistor $Q_3$. Activating transistor $Q_3$ permits conduction between emitter/source region 108 and collector/drain region 109 in PMOS transistor $Q_3$. Conduction in transistor $Q_3$ couples a high voltage level $V_{cc}$ to input/output line 152. The presence of a high voltage or enhanced voltage on input/output line 152 and the cross-coupled nature of the inverters affects the gate in PMOS transistor $Q_1$, forcing PMOS transistor $Q_1$ to remain off. Simultaneously, the ground voltage potential of load resistor 195 is coupled through n-channel transistor $Q_2$ to input/output line 150, pulling input/output line 150 to ground. The cross coupled nature of the sense amplifier serves to further turn on transistor $Q_2$, pulling line 150 even further to ground.

Alternatively, if bit line B/L 190 carried a logic state of "1", the cross-coupled nature of inverters 104 and 103 would force the gate of PMOS transistor $Q_3$ to remain off. Meanwhile, the ground potential level associated with load transistor 196 would couple through activated NMOS transistor $Q_4$ and the cross-coupled nature of inverters 104 and 103 would activate the gate in PMOS transistor Q1. The low voltage level at the gate of transistor $Q_1$ would turn on transistor Q1, permitting conduction between emitter/source 108 and collector/drain 109 of PMOS transistor $Q_1$. Conduction through PMOS transistor $Q_1$ would couple a high voltage level $V_{cc}$ to input/output line 150, driving input/output line 150 higher, and simultaneously, driving input/output line 152 to ground through transistor $Q_4$.

While the above operation has been described for the exemplary embodiment of a current sense amplifier 145, one of ordinary skill in the art will understand that other configurations are available which do not depart from the scope of the present invention.

Figure 5A:
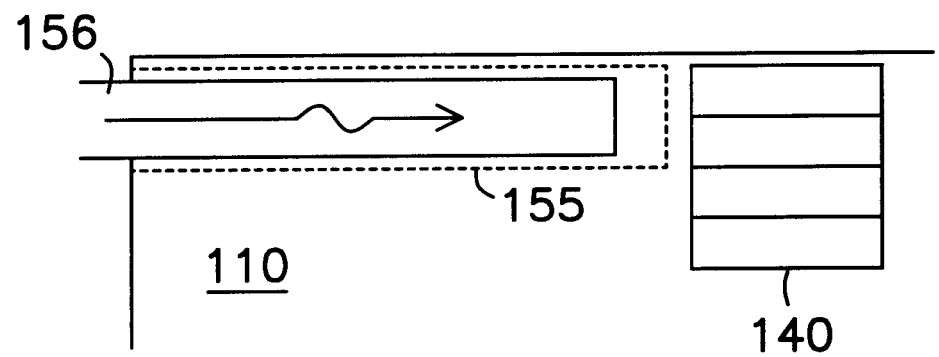
FIG. 5A is a cross-sectional view illustrating in greater detail an embodiment of the optical detector portion of the present invention.

FIG. 5A is a cross-sectional view illustrating in greater detail a portion of an embodiment of the optical receiver 140 and the V-grooves 155, including an optical fiber 156 mounted in the V-groove 155. Optical receiver 140 is described in more detail in connection with FIG. 6.

Figure 5B:
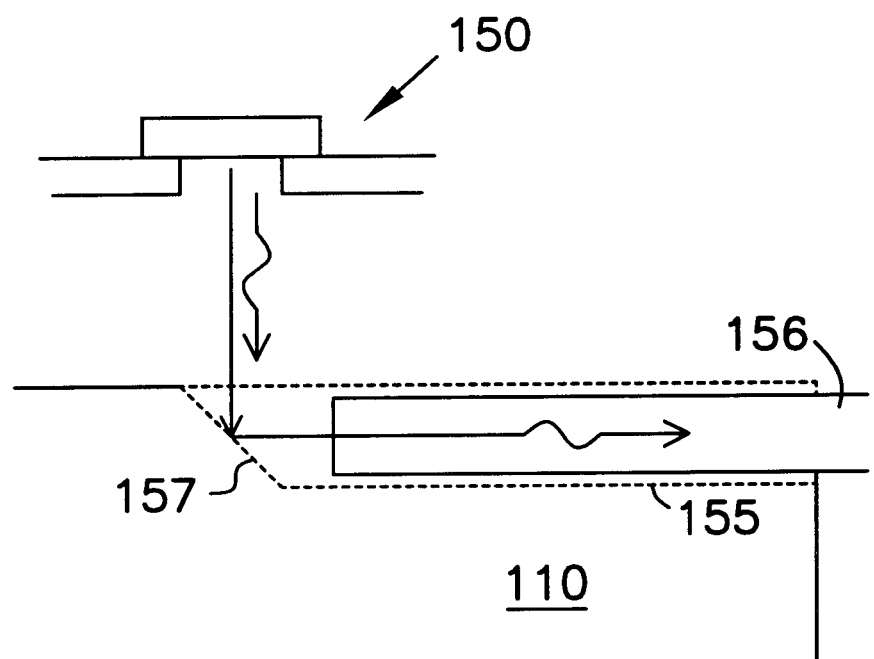
FIG. 5B is a cross-sectional view illustrating in greater detail an embodiment of the optical emitter portion of the present invention.

FIG. 5B is a cross-sectional view illustrating in greater detail a portion of an embodiment of the optical emitter 150. As illustrated in FIG. 5B, photons of light are transmitted from the optical emitter 150 into the optical fibers 156. In one embodiment, the optical emitter 150 includes a light-emitting diode (LED) 150. The light-emitting diode (LED) 150 can be, for instance, a gallium arsenide (GaAs) emitter. In one embodiment, as illustrated in FIG. 5B, the coupling between the optical emitter 150 and the fiber optical network 165 includes optical fibers 156 mounted in V-grooves 155 on the silicon interposer 110. This optical coupling can be achieved in any suitable manner such as, for example, the method described in V. Vusirikala, et al., "Flip-chip optical fiber attachment to a monolithic optical receiver chip," Proc. SPIE Emerging Components and Technologies for all Optical Networks, Philadelphia, Pa., USA, Oct. 24, 1995, pp. 52–58. In one embodiment, the optical emitter 150 is flip chip bonded to the silicon interposer and an end 157 in a V-groove 155 is adapted to reflect photons of light from the optical emitter 150 into the optical fibers 156. This technique, too can be achieved in any suitable manner such as, for example, the method described in O. Vendier et al., "A 155 Mbps digital transmitter using GaAs thin film LEDs bonded to silicon driver circuits," Dig. IEEE/LEOS Summer Topical Mtg., Keystone Colo., Aug. 5–9, 1996, pp. 15–16.

Figure 6:
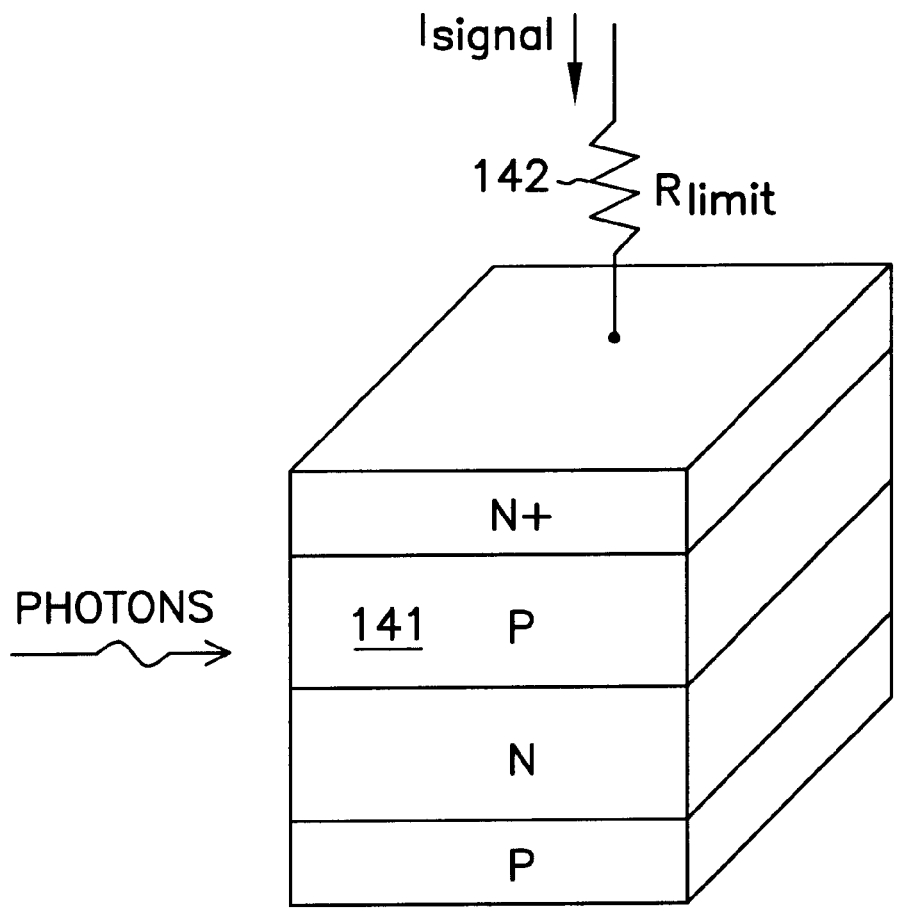
FIG. 6 illustrates an embodiment of an optical detector according to the teachings of the present invention.

FIG. 6 provides in greater detail a perspective of the optical receiver 140. In one exemplary embodiment, the optical receiver 140 is a thyristor detector 140. In the exemplary embodiment, the thyristor detector 140 is an appropriately doped silicon thyristor detector 140. In an alternate embodiment, the thyristor detector 140 includes a gallium-arsenide (GaAs) emitter 140. As illustrated by FIG. 6, photons of light strike the base 141 of the silicon thyristor detector 140 and activate the silicon thyristor detector 140. Based on bipolar transistor theory, the light pulse generates charge in the base 141 of the silicon thyristor detector 140 which then turns on providing a current gain, and potentially large signal current (I), or emitter current (I), in the silicon thyristor detector 140.

As technology demands push transistor design below 1.0 micro-meter ($\mu$m) in size, and as low power portable integrated circuits (IC) applications become prevalent, it is highly desirable to reduce the power dissipation required in driving IC devices. For illustrative purposes, a wire-bonded line on a circuit board with 1 nano-second (ns) switching speeds at 100 MHz is briefly described here. Typically, a large power dissipation/output results from the larger stray capacitances associated with the lead bond package, and wiring on the circuit board, estimated to be 10 pico-Farads (pF). This amounts to a large energy required per switching event of 125 pico-Joules (pJ) in driving each output. By comparison, the same scenario calculation for driving a flip chip bonded line on an interposer at 100 MHz amounts to a power dissipation which is about one order of magnitude smaller. This is due to the low stray capacitance associated with the flip-chip solder ball bonds, estimated to be as low as 50 femto-Farads (fF). This results in an energy of 12.5 pJ per switching event at each output.

Recent design work has shown that the energy expended per switching event using optical interconnections can provide even better results. The energy expended per switching event with optical interconnections can be extremely low, e.g., only about 10 femto Joules (fJ) are required to activate a silicon thyristor detector 140. In an exemplary embodiment, even a silicon thyristor detector 140 with a low optical efficiency in the emitter, e.g., a 10% efficiency, will produce the requisite activation energy. In example, a 100 (fJ) pulse of light will provide 10 (fJ) to the base 141 of the silicon thyristor detector 140. In an exemplary embodiment, a 1-nano-second (ns) light pulse to the base 141 of a silicon thyristor detector 140, having a volume for the p and/or n regions of $(2 \times 10^{-5} \text{ cm})^3$ or $8 \times 10^{-15}$ cm$^3$ and a carrier concentration ($n_p$) of approximately $6 \times 10^{18}$ carriers per centimeters cubed, creates approximately $5 \times 10^4$ electron hole pairs. These numbers are as calculated for silicon having an energy band gap of 1.43 electron volts. Under these parameters, a signal current (I) is calculated at 800 micro-Amperes ($\mu$A).

A signal current (I), or emitter current (I), of 30 micro-Ampere ($\mu$A) is necessary to activate the current sense amplifier 145. Such a signal current (I) can be attained at a signal current (I) of $10^6$ electrons for a 5 nano-seconds (ns) duration. Thus it is evident, that for the parameters provided above, a 10 (fJ) light pulse is more than sufficient to trigger the silicon thyristor detector 140. So too, the above parameters of device size and doping concentration can be varied to achieve similar results. Such variations do not depart from the scope of the present invention as will be understood by one of ordinary skill in the art of integrated circuits upon reading this invention. In an exemplary practice, the signal current (I) is limited using a load, or limiting, resistor 142 to reduce power dissipation.

Figure 7:
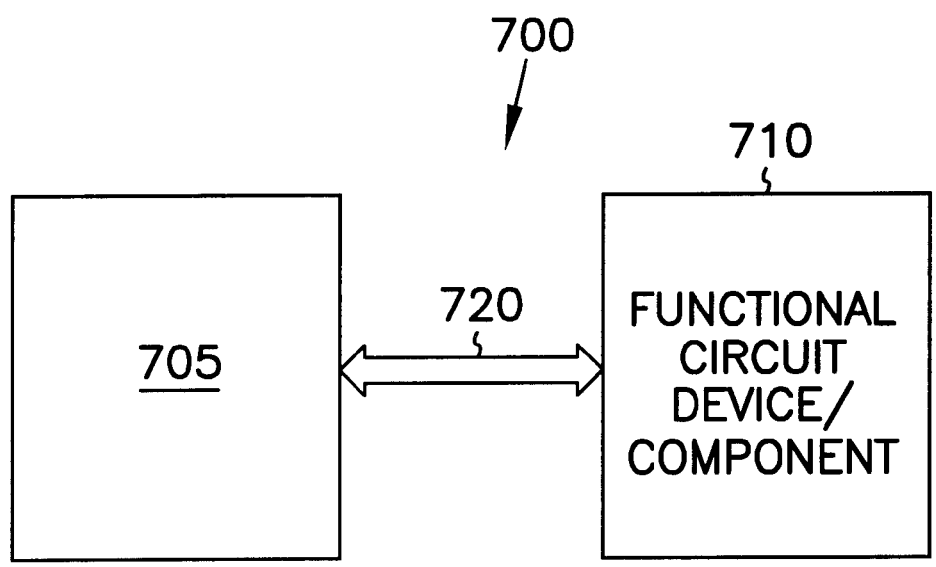
FIG. 7 is a block diagram illustrating an electronic system according to an embodiment of the present invention.

FIG. 7 is a block diagram illustrating an electronic system 700 according to an embodiment of the present invention. The electronic system 700 includes an electronic packaging assembly 705. The electronic packaging system 705 includes the electronic packaging assembly 705 presented and described in detail above. The electronic system 700 includes a number of external devices 710. The number of external devices 710 include, for example, microprocessors and memory chips external to the electronic packaging assembly 705. The electronic system 700 includes a system bus 720. The system bus 720 couples the number of external devices 710 to the optical fiber network 165 of the electronic packaging system 705.

Figure 8:
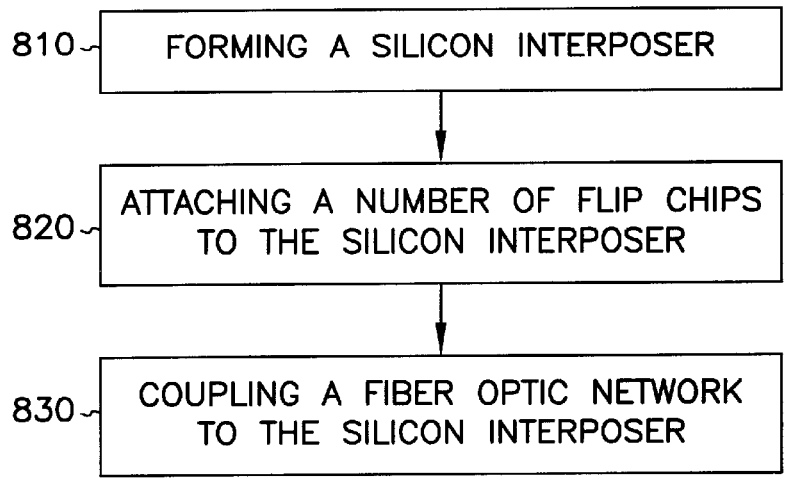
FIG. 8 illustrates, in flow diagram form, methodical aspect according to the teachings of the present invention.

FIG. 8 illustrates in flow diagram form a methodical aspect according to the teachings of the present invention. A silicon interposer is formed wherein the silicon interposer includes micro-machined vias at 810. A number of flip chips are attached to the silicon interposer wherein the flip chips couple to the micro-machined vias at 820. A fiber optical network is coupled to the silicon interposer at 830.

Figure 9:
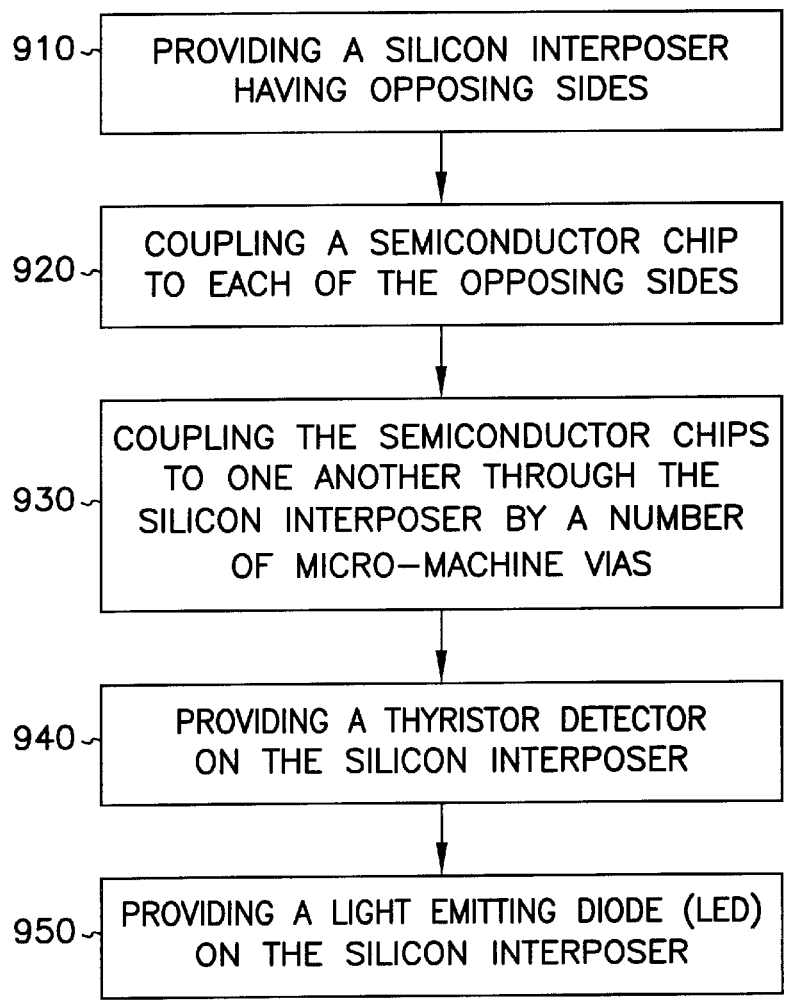
FIG. 9 illustrates, in flow diagram form, another methodical aspect according to the teachings of the present invention.

FIG. 9 illustrates in flow diagram form a methodical aspect according to the teachings of the present invention. A silicon interposer having opposing sides is provided at 910. A semi-conductor chip is coupled to each of the opposing sides of the silicon interposer at 920. The semi-conductor chips on each side of the silicon interposer are coupled to one another through the silicon interposer by a number of micro-machined vias at 930. The micro-machined vias provide electrical connections between the opposing sides of the silicon interposer. A thyristor detector is provided on the silicon interposer at 940 for receiving input signals from a fiber optical network. The thyristor detector is further coupled to a sense amplifier. The sense amplifier is coupled to at least one of the semi-conductor chips. A light-emitting diode is provided at 950 on the silicon interposer. The light-emitting diode couples output signals from at least one of the semi-conductor chips to the fiber optical network. An exemplary embodiment, coupling a semi-conductor chip to each of the opposing sides of the silicon interposer includes attaching a microprocessor chip to the first side of the silicon interposer. Further, coupling a semi-conductor chip to each of the opposing sides of the silicon interposer includes attaching a memory chip to the second side of the silicon interposer. In selective embodiments, attaching a memory chip to the second side of the silicon interposer includes attaching a DRAM chip, an SRAM chip or a EEPROM chip. In alternative embodiments, other circuitry designs can be coupled to the opposing sides of the silicon interposer. Similarly, capacitor devices can be coupled to the opposing sides of the silicon interposer.

Figure 10:
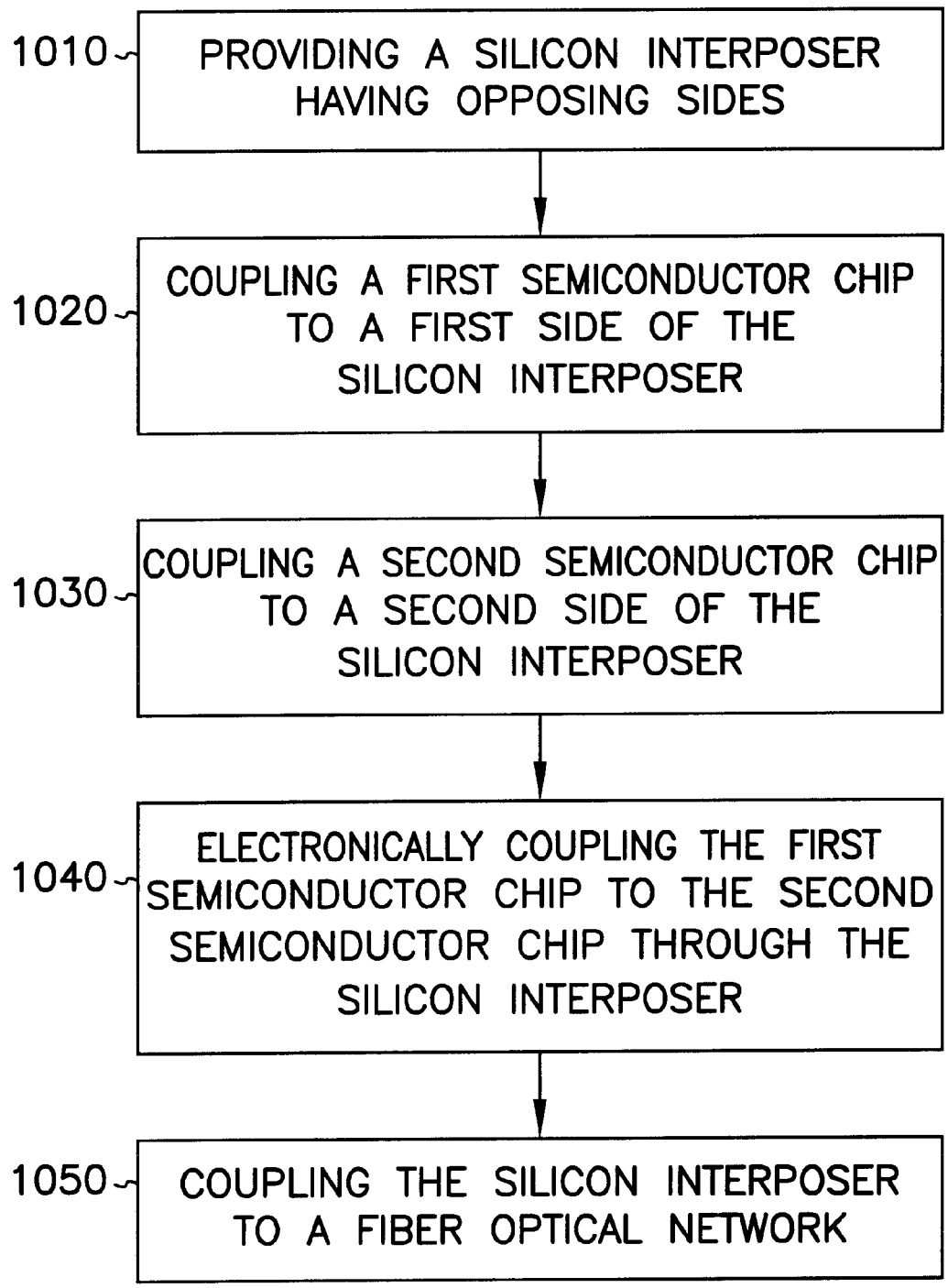
FIG. 10 illustrates, in flow diagram form, another methodical aspect according to the teachings of the present invention.

FIG. 10 illustrates, in flow diagram form, a methodical aspect according to the teachings of the present invention. A silicon interposer having opposing sides is provided at 1010. A first semi-conductor chip is coupled to a first side of the silicon interposer at 1020. A second semi-conductor chip is coupled to a second side of the silicon interposer at 1030. The first semi-conductor chip is electrically coupled to the second semi-conductor chip through the silicon interposer at 1040. The silicon interposer in coupled to a fiber optical network at 1050. In one exemplary embodiment, coupling a first semi-conductor to the first side of the silicon interposer includes coupling a microprocessor chip to the first side. In another exemplary embodiment, coupling a second semi-conductor chip to the second side of the silicon interposer includes coupling a memory chip to the second side of the silicon interposer. In alternative embodiments, the nature of the semi-conductor chips coupled respectively to the first and second sides can be reversed or varied in any desired order such that capacitors are similarly coupled to the silicon interposer, or memory chips are coupled to the first side and microprocessors are coupled to the second side. Likewise, microprocessors and memory chips may be coupled to the same side of the silicon interposer.

Figure 11:
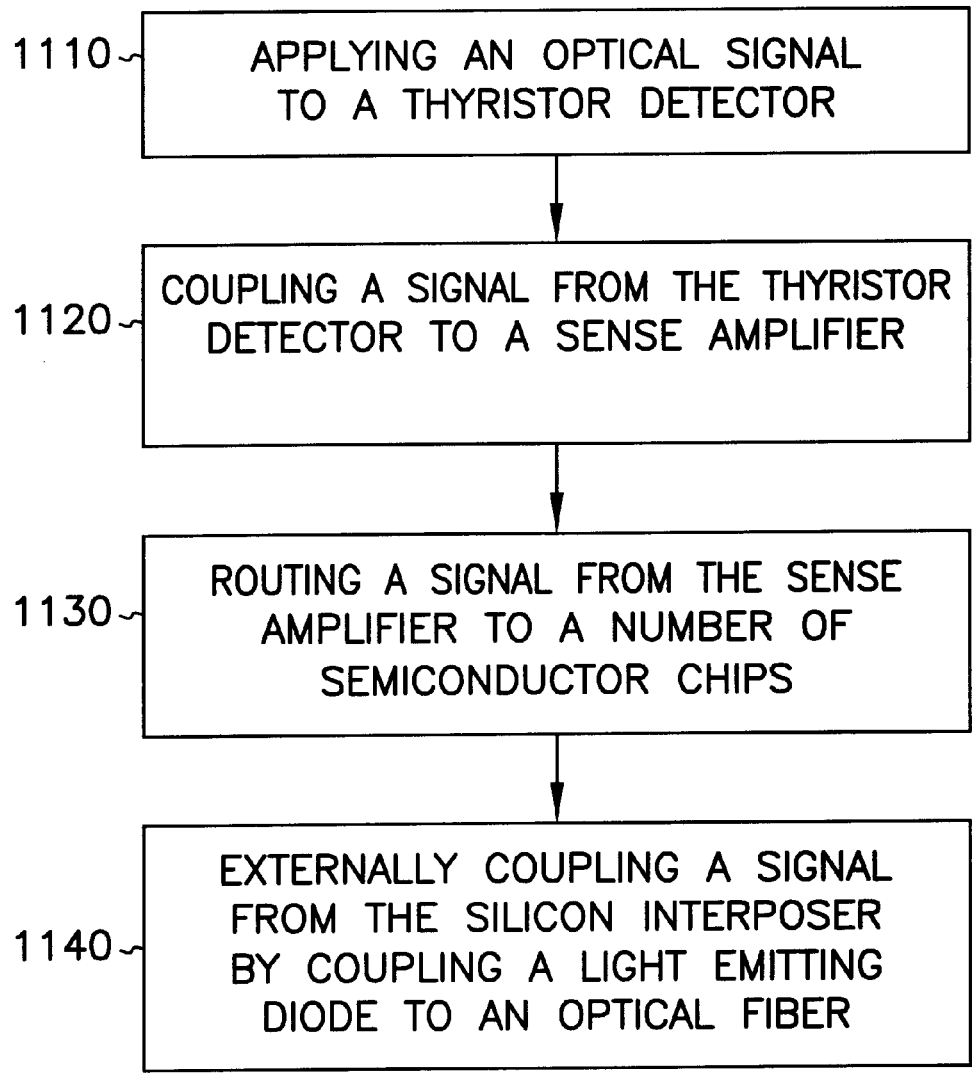
FIG. 11 illustrates, in flow diagram form, a methodical embodiment for operating the present invention.

FIG. 11 illustrates a method for operating an integrated circuit according to the teachings of the present invention. An optical signal is applied to a thyristor detector at 1110. A signal from the thyristor detector is coupled to a sense amplifier at 1120. A signal from the sense amplifier is routed to a number of semi-conductor chips at 1130. The semi-conductor chips are located on opposing sides of a silicon interposer and are coupled to one another by micro-machined vias which extend through the silicon interposer. A signal is externally coupled from the silicon interposer at 1140. The signal is externally coupled from the silicon interposer by coupling a light-emitting diode to an optical fiber. In an exemplary embodiment, applying an optical signal to a thyristor detector includes applying an optical signal to a silicon thyristor detector. In an alternative embodiment, applying an optical signal to a thyristor detector includes applying the optical signal to a gallium-arsenide thyristor detector. The exemplary embodiment includes coupling a signal from the thyristor detector to a sense amplifier includes coupling the signal to a current sense amplifier. In the exemplary embodiment, the signal is externally coupled from the silicon interposer by coupling a gallium-arsenide emitter to an optical fiber. The optical fiber is mounted in a V-groove on the silicon interposer.

Conclusion

An improved electronic packaging assembly is provided for increasing the operational bandwidth between different circuit devices, e.g. logic and memory chips, without requiring changes in current CMOS processing techniques. The electronic packaging assembly includes the use of a silicon interposer. The silicon interposer can consist of recycled rejected wafers from the front-end semiconductor processing. The electronic packaging assembly also includes at least one, or a number of, semiconductor chips located on opposing surfaces of the silicon interposer.

Micro-machined vias are formed through the silicon interposer. The micro-machined vias include electrical contacts which couple various integrated circuit devices located on the opposing surfaces of the silicon interposer. An optical detector and an optical emitter are located on the silicon interposer and couple the silicon interposer to a fiber optical network. Improved performance in the form of higher bandwidth and a lower required energy per switching event is provided by this novel electronic packaging assembly.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for constructing an integrated circuit, comprising:

forming a silicon interposer, wherein the interposer includes micro-machined vias;

attaching a number of flip chips to the silicon interposer, wherein the flip chips couple to the micro-machined vias; and coupling a fiber optic network to the silicon interposer.

2. The method of claim 1, wherein coupling a fiber optic network to the silicon interposer includes:

providing a thyristor detector on the silicon interposer for receiving input signals from the fiber optical network;

coupling the thyristor detector to a current sense amplifier; and coupling the current sense amplifier to the at least one of the number of flip chips on the silicon interposer.

3. The method of claim 2, wherein providing the thyristor detector includes providing v-grooves on the silicon interposer and mounting optical fibers in the v-grooves.

4. The method of claim 2, wherein providing the thyristor detector includes providing a silicon thyristor detector.

5. The method of claim 1, wherein coupling a fiber optic network to the silicon interposer includes:

providing a light emitting diode (LED) on the silicon interposer;

providing a number of v-grooves in the silicon interposer and mounting optical fibers in the v-grooves in order to align the optical fibers with the light emitting diode (LED); and providing an end in a v-groove to reflect light into the optical fibers, whereby the light emitting diode (LED) couples signals from the number of flip chips on the silicon interposer to the fiber optical network.

6. The method of claim 5, wherein providing the light emitting diode (LED) includes micro-bump bonding (MBB) the light emitting diode (LED) to the silicon interposer.

7. The method of claim 5, wherein providing a light emitting diode (LED) includes providing a gallium arsenide (GaAs) emitter.

8. A method for forming an integrated circuit, comprising:

providing a silicon interposer having opposing sides;

coupling a semiconductor chip to each of the opposing sides of the silicon interposer;

coupling the semiconductor chips on each side of the silicon interposer to one another through the silicon interposer by a number of micro-machined vias, wherein the micro-machined vias provide electrical connections between the opposing sides of the silicon interposer;

providing a thyristor detector on the silicon interposer for receiving input signals from a fiber optical network, wherein the thyristor detector is further coupled to a sense amplifier, and wherein the sense amplifier is coupled to at least one of the semiconductor chips; and providing a light emitting diode (LED) on the silicon interposer, wherein the light emitting diode (LED) couples output signals from at least one of the semiconductor chips to the fiber optical network.

9. The method of claim 8, wherein coupling a semiconductor chip to each of the opposing sides of the silicon interposer includes attaching a microprocessor chip to the first side of the silicon interposer.

10. The method of claim 8, wherein coupling a semiconductor chip to each of the opposing sides of the silicon interposer includes attaching a memory chip to the second side of the silicon interposer.

11. The method of claim 10, wherein attaching a memory chip to the second side of the silicon interposer includes attaching a DRAM chip to the second side of the silicon interposer.

12. The method of claim 10, wherein attaching a memory chip to the second side of the silicon interposer includes attaching an SRAM chip to the second side of the silicon interposer.

13. The method of claim 10, wherein attaching a memory chip to the second side of the silicon interposer includes attaching a flash EEPROM chip to the second side of the silicon interposer.

14. A method for forming integrated circuits, comprising:

providing a silicon interposer having opposing sides;

coupling a first semiconductor chip to a first side of the silicon interposer;

coupling a second semiconductor chip to a second side of the silicon interposer;

electrically coupling the first semiconductor chip to the second semiconductor chip through the silicon interposer; and coupling the silicon interposer to a fiber optical network.

15. The method of claim 14, wherein providing the silicon interposer having opposing sides includes providing a silicon interposer formed from recycled silicon wafers.

16. The method of claim 14, wherein coupling the first semiconductor chip to the first side of the silicon interposer includes coupling a microprocessor chip to the first side.

17. The method of claim 14, wherein coupling the second semiconductor chip to the second side of the silicon interposer includes coupling a memory chip to the second side of the silicon interposer.

18. The method of claim 14, wherein coupling the first semiconductor chip to the second semiconductor chip includes forming micro-machined vias through the silicon interposer in order to connect the opposing sides.

19. A method for operating an integrated circuit, comprising:

applying an optical signal to a thyristor detector;

coupling a signal from the thyristor detector to a sense amplifier;

routing a signal from the sense amplifier to a number of semiconductor chips which are located on opposing sides of a silicon interposer and are coupled to one another by micro-machined vias which extend through the silicon interposer; and externally coupling a signal from the silicon interposer by coupling a light emitting diode to an optical fiber.

20. The method of claim 19, wherein applying a optical signal to a thyristor detector includes applying an optical signal to a silicon thyristor detector.

21. The method of claim 19, wherein applying a optical signal to a thyristor detector includes applying an optical signal to a gallium arsenide (GaAs) thyristor detector.

22. The method of claim 19, wherein coupling a signal from the thyristor detector to a sense amplifier includes coupling the signal to a current sense amplifier.

23. The method of claim 19, wherein externally coupling a signal from the silicon interposer by coupling a light emitting diode to an optical fiber includes coupling a gallium arsenide (GaAs) emitter to an optical fiber, wherein the optical fiber is mounted in a v-groove on the silicon interposer.

* * * * *

UNITED STATES PATENT AND TRADEMARK OFFICE
CERTIFICATE OF CORRECTION

PATENT NO. : 6,821,802 B2
DATED : November 23, 2004
INVENTOR(S) : Ahn et al.

It is certified that error appears in the above-identified patent and that said Letters Patent is hereby corrected as shown below:

Title page,
Item [56], References Cited, OTHER PUBLICATIONS,
"Crisp" reference, delete "(May 18-21 (1997)" and insert -- (May 18-21, 1997) --, therefor.
"Krishnamoorthy" reference, delete "Cricuits" and insert -- Circuits --, therefor.
"Shafai" reference, delete "Temerature" and insert -- Temperature --, therefor.
"Vendier" reference, delete "Aplications" and insert -- Applications --, therefor.

Column 3,
Line 60, delete "et al" and insert -- et al. --, therefor.

Column 4,
Line 20, delete "a" before "number".

Column 5,
Line 3, delete "Wt" and insert -- wt. --, therefor.

Column 6,
Line 24, delete "atop" and insert -- a top --, therefor.
Line 34, delete "metalization" and insert -- metallization --, therefor.

Column 7,
Line 40, delete "Phys" and insert -- Phys. --, therefor.

Column 8,
Line 2, delete "an" and insert -- on --, therefor.
Line 3, delete "amonia" and insert -- ammonia --, therefor.
Line 61, delete "Flectron" and insert -- Electron --, therefor.

Column 11,
Line 20, delete "$8 \times 10^{-15}$ cm$^3$" and insert -- $8 \times 10^{-15}$ cm$^{-3}$ --, therefor.

UNITED STATES PATENT AND TRADEMARK OFFICE
CERTIFICATE OF CORRECTION

PATENT NO. : 6,821,802 B2
DATED : November 23, 2004
INVENTOR(S) : Ahn et al.

It is certified that error appears in the above-identified patent and that said Letters Patent is hereby corrected as shown below:

Column 16,
Lines 6 and 9, delete "a" and insert -- an --, therefor.

Signed and Sealed this

Twenty-sixth Day of April, 2005

JON W. DUDAS
*Director of the United States Patent and Trademark Office*